United States Patent [19]
Kunda et al.

[11] Patent Number: 5,793,233
[45] Date of Patent: Aug. 11, 1998

[54] APPARATUS AND METHOD FOR GENERATING A PHASE DETECTION SIGNAL THAT COORDINATES THE PHASES OF SEPARATE CLOCK SIGNALS

[75] Inventors: Ramachandra P. Kunda, Milpitas; Gary Goldman, San Jose, both of Calif.

[73] Assignee: Sun Microsystems, Inc., Mountain View, Calif.

[21] Appl. No.: 655,475

[22] Filed: May 30, 1996

[51] Int. Cl.$^6$ ............................................. H03L 7/00
[52] U.S. Cl. .................... 327/145; 327/3; 327/12; 327/153; 326/93; 326/96; 375/362
[58] Field of Search ...................... 327/1, 2, 3, 7, 327/12, 141, 144, 145, 152, 153, 154, 161, 162, 163, 231, 237, 239, 258, 269, 270; 326/93, 96; 375/354, 362; 324/76.77, 76.82

[56] References Cited

U.S. PATENT DOCUMENTS

| | | | |
|---|---|---|---|
| 4,675,612 | 6/1987 | Adams et al. | 327/142 |
| 4,760,280 | 7/1988 | Schwefel et al. | 327/258 |
| 4,851,710 | 7/1989 | Grivna | 327/160 |
| 4,855,615 | 8/1989 | Humpleman | 327/152 |
| 4,935,942 | 6/1990 | Hwang et al. | 327/269 |
| 5,272,391 | 12/1993 | Ampe et al. | 327/231 |

Primary Examiner—Timothy P. Callahan
Assistant Examiner—Kenneth B. Wells
Attorney, Agent, or Firm—Flehr Hohbach Test Albritton & Herbert LLP; William S. Galliani

[57] ABSTRACT

A phase detection signal is generated with a phase detection logic pipeline and its associated tapped pipeline signal combinational logic circuit. The phase detection logic pipeline generates phase detection logic pipeline output signals from a first input clock signal and a second input clock signal. The first input clock signal is applied to a first flip-flop of a set of serially connected flip-flops to generate a pipeline signal. The pipeline signal is driven through the set of serially connected flip-flops by the second clock input signal. Logic pipeline output nodes connected between the serially connected flip-flops carry the phase detection logic pipeline output signals. The phase detection logic pipeline output signals are applied to the tapped pipeline signal combinational logic circuit, which logically combines the signals to generate the phase detection signal.

22 Claims, 5 Drawing Sheets

APPARATUS AND METHOD FOR GENERATING A PHASE DETECTION SIGNAL THAT COORDINATES THE PHASES OF SEPARATE CLOCK SIGNALS

BRIEF DESCRIPTION OF THE INVENTION

This invention relates generally to phase detection logic that is used to coordinate multiple clock signals used in complex integrated digital circuits. More particularly, this invention relates to a technique for generating a phase detection signal from a set of clock signals that are applied to a phase detection logic pipeline with associated tapped pipeline combinational logic.

BACKGROUND OF THE INVENTION

Complex integrated circuits frequently use multiple clock signals. For example, a first portion of a complex integrated circuit may use a first clock signal operating at a first frequency, while a second portion of the complex integrated circuit may use a second clock signal operating at a second frequency. At times it is necessary to pass data from the first portion of the complex integrated circuit to the second portion of the complex integrated circuit. For this to occur, the first clock signal must be coordinated with the second clock signal. A phase detection signal is used for this purpose.

The prior art use of a phase detection signal in a complex integrated circuit is illustrated in FIG. 1. FIG. 1 illustrates a complex integrated circuit 20, for example, a microprocessor of a general purpose computer. The complex integrated circuit 20 includes a first logic circuit (logic circuit A) 22 and a second logic circuit (logic circuit B) 24. A first clock signal (clock 1 signal) operating at a first frequency is applied to logic circuit B 24, while a second clock signal (clock 2 signal) operating at a distinct second frequency is applied to logic circuit A 22. A signal bus 26 is used to pass data between logic circuit A 22 and logic circuit B 24.

Data must be passed between logic circuit A 22 and logic circuit B 24 when the first clock signal and the second clock signal are coordinated, for example at the instance when they both have the same rising edge. Phase detection logic circuit 28 is used to coordinate different clock signals. As shown in FIG. 1, the phase detection logic circuit 28 receives the first clock signal (clock 1 signal) and the second clock signal (clock 2 signal). Based upon these clock signals, the phase detection logic circuit 28 generates a phase detection signal that is applied to a phase detection signal line 30, which is connected to logic circuit A 22 and logic circuit B 24. Logic circuit A 22 and logic circuit B 24 use standard techniques to process the phase detection signal such that each circuit knows when to pass information to the other circuit. That is, the phase detection signal includes a set of signal transitions. A selected signal transition is used by logic circuit A 22 and logic circuit B 24. The selected signal transition coordinates the two clock signals. For example, the selected signal transition may indicate to logic circuit A 22 and logic circuit B 24 that the time of the next upward clock transition will be identical for the first clock signal (clock 1 signal) and the second clock signal (clock 2 signal). Because there is coordination between the two clock signals at that designated instance, data passed over the signal bus 26 at that time will be considered to be valid data by the receiver. Consequently, the phase detection signal allows the correct exchange of data between two logic circuits operating at different clock frequencies.

FIG. 2 illustrates a phase detection logic circuit 28 in accordance with a known prior art technique. The phase detection logic circuit 28 of FIG. 2 relies upon signal comparison logic 32 and a state machine 34. The signal comparison logic 32 process the first clock signal (clock 1 signal), the second clock signal (clock 2 signal), a first phase detection signal (phase 1 signal), a second phase detection signal (phase 2 signal), a third phase detection signal (phase 3 signal), and a feedback signal (from the state machine 34). The first phase detection signal, the second phase detection signal, and the third phase detection signal are clock signals with predetermined phase relationships. The first phase detection signal, the second phase detection signal, or the third phase detection signal is designated by the signal comparison logic 32 as the phase detection signal.

That is, the signal comparison logic circuit 32 assesses the first clock signal (clock signal 1) and the second clock signal (clock signal 2) and then selects one of the input phase signals (phase 1 signal, phase 2 signal, or phase 3 signal) as the phase detection signal. The signal is selected by determining which input phase signal will accurately identify the coordination between the first clock signal and the second clock signal. When the different input phase signals do not accurately identify the coordination between the first clock signal and the second clock signal, the signal comparison logic 32 generates an output signal that is applied to the state machine 34. The state machine 34 waits a predetermined period of time based upon the value of the output signal. The signal comparison logic circuit 32 is then allowed to compare the various input signals after the predetermined period of time. The state machine 34 thereby forces one of the input phase signals to accurately identify the coordination between the first clock signal and the second clock signal. The phase detection signal is then applied to different regions of the circuit that operate at different clock speeds, as discussed in reference to FIG. 1.

The problem with the phase detection logic circuit 28 of FIG. 2 is that the signal comparison logic circuit 32 and state machine 34 require a relatively large amount of logic for implementation. Thus, the circuit of FIG. 2 is silicon-intensive and inefficient. It would be highly desirable to reduce the amount of logic and silicon required to implement a phase detection logic circuit.

Another problem with the phase detection logic circuit of FIG. 2 is that it is not dynamically adjustable. That is, the phase detection logic circuit of FIG. 2 must operate with known input clock signals. If the frequency of one of the input clock signals is altered, for instance during testing, then an accurate phase detection signal cannot be generated to correspond to the altered input clock signal. In other words, the previously generated phase detection signal remains the same despite varying input clock signals. Thus, it would be highly desirable to provide a phase detection logic circuit that can dynamically adjust to changing clock frequencies.

SUMMARY OF THE INVENTION

A phase detection signal is generated with a phase detection logic pipeline and its associated tapped pipeline signal combinational logic circuit. The phase detection logic pipeline generates phase detection logic pipeline output signals from a first input clock signal and a second input clock signal. The first input clock signal is applied to a first flip-flop of a set of serially connected flip-flops to generate a pipeline signal. The pipeline signal is driven through the set of serially connected flip-flops by the second clock input signal. Logic pipeline output nodes connected between the serially connected flip-flops carry the phase detection logic pipeline output signals. The phase detection logic pipeline output signals are applied to the tapped pipeline signal combinational logic circuit, which logically combines the signals to generate the phase detection signal.

The invention utilizes an efficient logic scheme to generate a phase detection signal. Thus, a relatively small amount of silicon is used to implement a phase detection circuit. The phase detection circuit can dynamically adjust to changing clock frequencies. In addition, the phase detection circuit is easily scaled for a large number of input clock signal ratios. Advantageously, the invention can be implemented with widely used logical elements, such as flip-flops, logical AND gates, and logical OR gates.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 3:
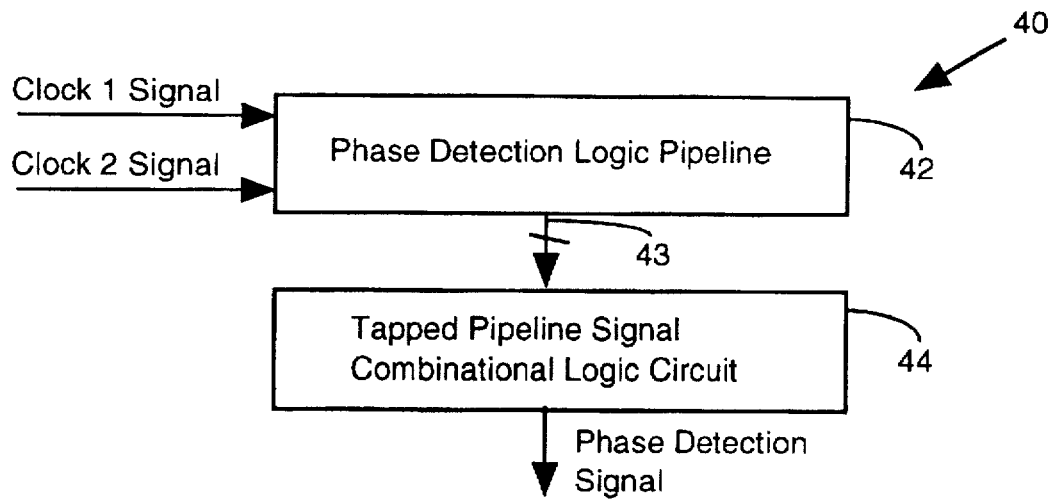
FIG. 3 illustrates a phase detection logic circuit in accordance with an embodiment of the invention.

FIG. 3 illustrates a phase detection circuit 40 constructed in accordance with one embodiment of the invention. The circuit 40 includes a phase detection logic pipeline 42, which receives a first input clock signal (clock 1 signal) operating at a first frequency and a second input clock signal (clock 2 signal) operating at a second frequency. The phase detection logic pipeline 42 uses a pipeline of circuit elements to generate phase detection logic pipeline output signals that characterize the phase relationship between the first clock input signal and the second clock input signal. The phase detection logic pipeline output signals are applied to logic pipeline output nodes 43. The logic pipeline output nodes 43 are connected to a tapped pipeline signal combinational logic circuit 44, which logically combines the phase detection logic pipeline output signals to generate a phase detection signal.

Figure 4:
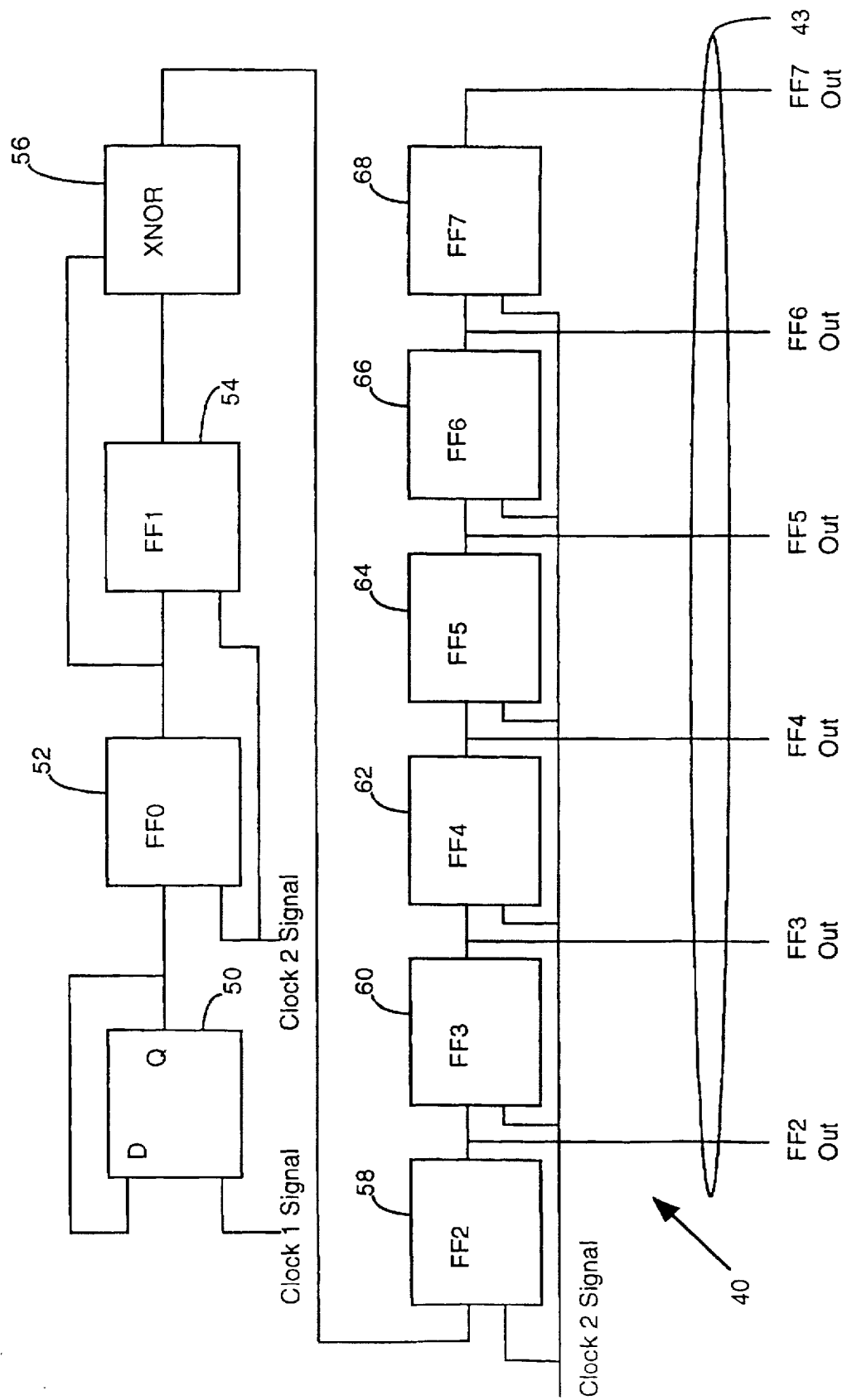
FIG. 4 illustrates a phase detection logic pipeline in accordance with an embodiment of the invention.

FIG. 4 illustrates a phase detection logic pipeline 40, in accordance with one embodiment of the invention. The phase detection logic pipeline 40 is implemented with a set of serially connected circuit elements that are used to characterize the phase relationship between the input clock signals to the phase detection logic pipeline 40. In the embodiment of FIG. 4, serially connected D flip-flops are used. The first input clock signal (clock 1 signal) is applied to a first flip-flop 50. The output of the first flip-flop 50 is a pipeline signal. The pipeline signal is applied to the remaining serially connected flip-flops, which are clocked by the second input clock signal (clock 2 signal). In particular, the pipeline signal is applied to flip-flop FF0 52, which is clocked by the second input clock signal (clock 2 signal). The signal is then applied to flip-flop FF1 54. The output of flip-flop FF1 54 is applied to a logical XNOR gate 56, whose output is connected to the input of a six stage pipeline of flip-flops 58–68. Each flip-flop of the remaining six flip-flops 58–68 has a tapped output node. That is, flip-flop 58 has a tapped output node FF2 out, flip-flop 60 has a tapped output node FF3 out, etc. In sum, the output nodes constitute logic pipeline output nodes 43.

The circuit of FIG. 4 is shown by way of example. Note that the serially connected circuit elements include flip-flops 50–52, 58–68 and at least one logical element 56. The precise combination of elements is not critical. What is critical is to establish a pipeline of elements that can be used to characterize the phase relationship of a set of input clock signals.

Any set of input clock signals will have a predetermined number of possible phase relationships. The phase detection logic pipeline 42 is used to characterize this phase relationship. A variety of pipeline structures may be used to characterize the phase relationship. In FIG. 4, the phase relationship is determined by driving the pipeline signal obtained from the first input clock signal through the remaining sequential elements that are clocked by the second input clock signal.

As indicated above, the phase detection logic pipeline output signals are applied to a tapped pipeline signal combinational logic circuit 44. The tapped pipeline signal combinational logic circuit 44 is used to assess the phase relationship of the input clock signals and generate a standard phase detection signal, which can be used in a standard way by different logic circuits operating at different clock rates.

Figure 5:
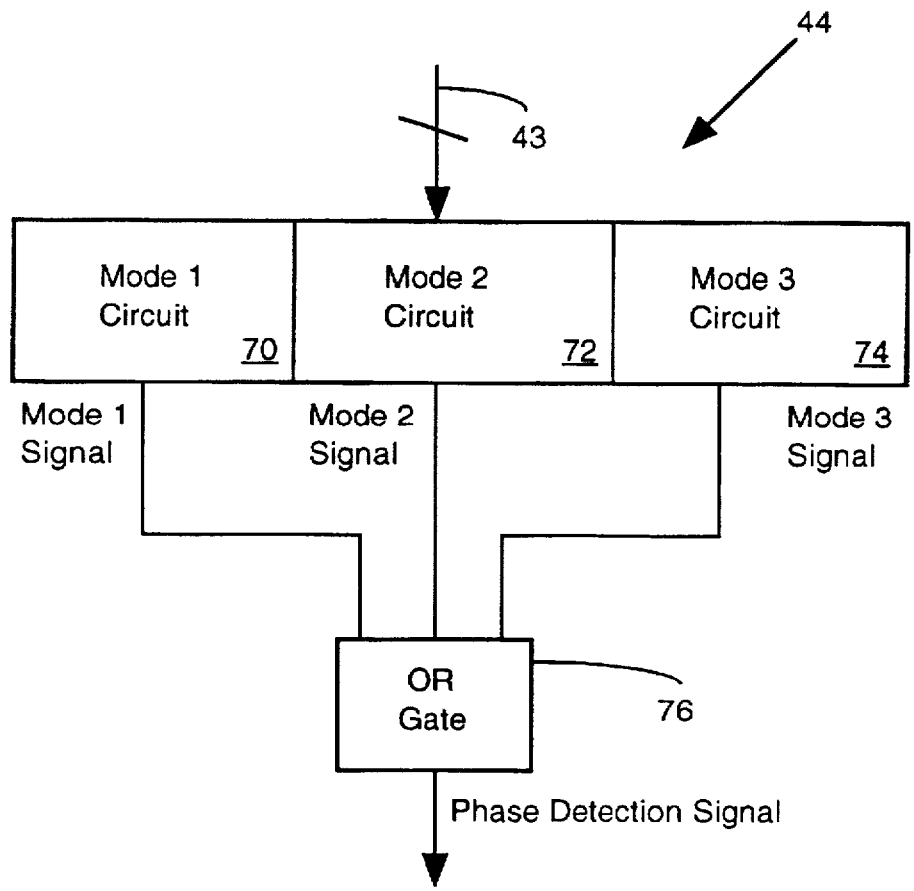
FIG. 5 illustrates a tapped pipeline signal combinational logic circuit in accordance with an embodiment of the invention.

FIG. 5 is a generalized illustration of one tapped pipeline signal combinational logic circuit 44 that may be used in accordance with the invention. The circuit of FIG. 5 includes a first mode circuit (mode 1 circuit) 70, a second mode circuit (mode 2 circuit) 72, and a third mode circuit (mode 3 circuit) 74. The circuits respectively generate a first mode output signal, a second mode output signal, and a third mode output signal, each of which is applied to a mode signal logical OR gate 76. The output of the mode signal logical OR gate 76 is a phase detection signal.

Thus, the tapped pipeline signal combinational logic circuit 44 processes the tapped output signals from the phase detection logic pipeline 42 in order to generate a phase detection signal. The tapped pipeline signal combinational logic circuit 44 may be implemented in any number of ways. Each implementation logically converts the signal phase relationship information obtained from the phase detection logic pipeline output signals into a phase detection signal. In other words, the set of digital HIGH and digital LOW phase detection logic pipeline output signals are converted into a set of digital HIGH and digital LOW signals that constitute a phase detection signal. Thereafter, the phase detection signal is processed in a standard manner.

Figure 6:
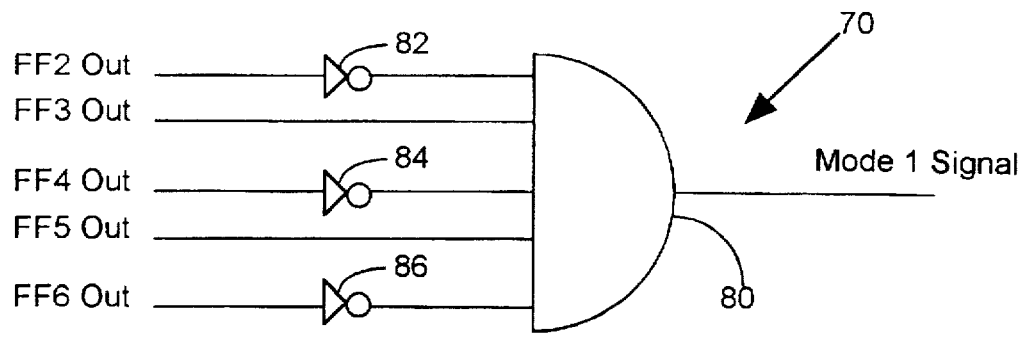
FIG. 6 illustrates a portion of the tapped pipeline signal combinational logic circuit in accordance with an embodiment of the invention.

FIG. 6 illustrates a first mode circuit 70 that may be used in accordance with the invention. The first mode circuit 70 includes a first logical AND gate 80, which receives phase detection logic pipeline output signals from output nodes FF2 out, FF3 out, FF4 out, FF5 out, FF6 out. Inverters 82, 84, and 86 are used to respectively invert the signals from output nodes FF2 out, FF4 out, and FF6 out. The first logical AND gate 80 generates a first mode output signal (mode 1 signal).

Figure 7:
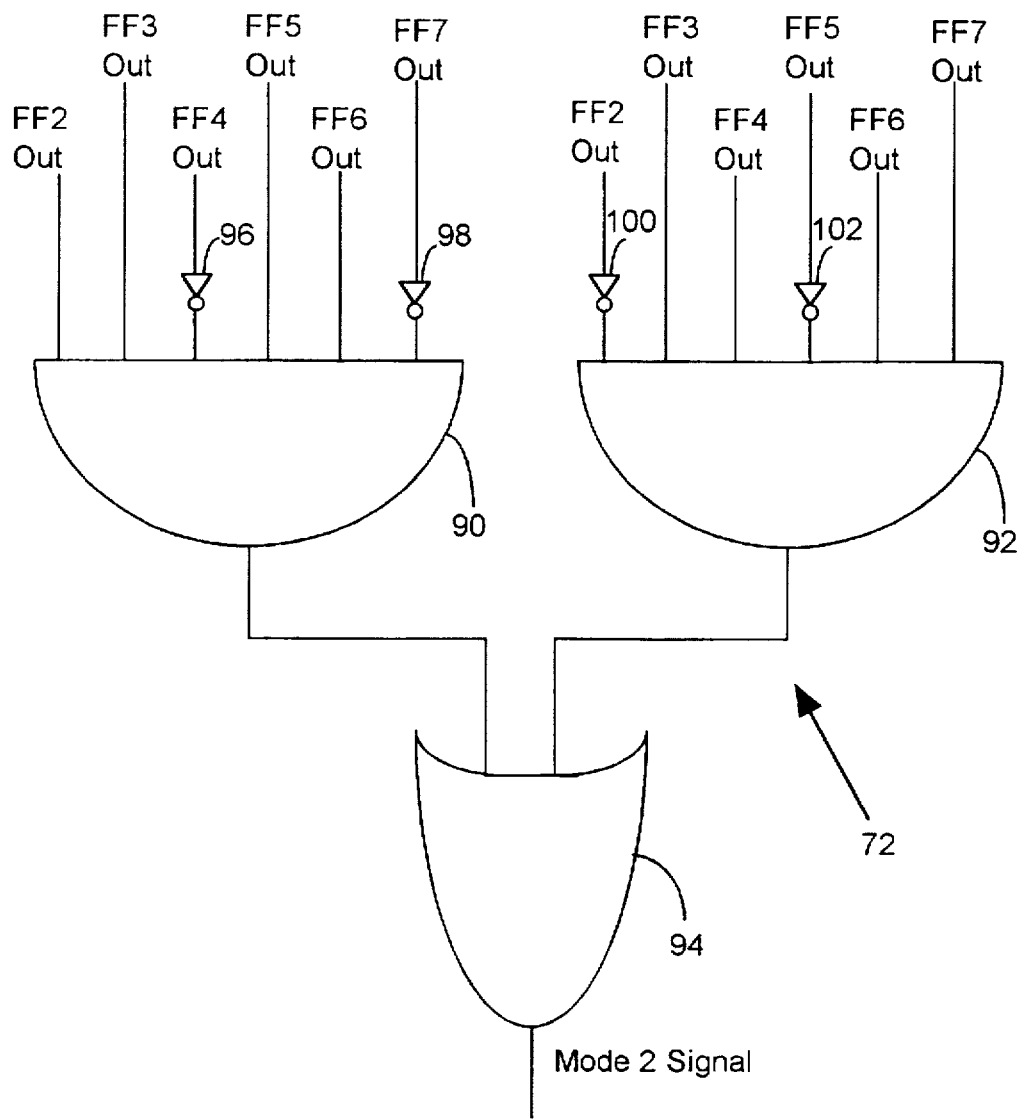
FIG. 7 illustrates a portion of the tapped pipeline signal combinational logic circuit in accordance with an embodiment of the invention.

FIG. 7 illustrates a second mode circuit 72 that may be used in accordance with the invention. The second mode circuit 72 includes a second logical AND gate 90, which receives phase detection logic pipeline output signals from output nodes FF2 out through FF7 out. The signal from the output node FF4 out is inverted by inverter 96, while the signal from the output node FF7 is inverted by inverter 98. The second mode circuit 72 also includes a third logical AND gate 92, which receives phase detection logic pipeline output signals from output nodes FF2 out through FF7 out. The signal from the output node FF2 out is inverted by inverter 100 and the signal from the output node FF5 is inverted by inverter 102.

The second logical AND gate 90 generates a first intermediate signal, while the third logical AND gate 92 generates a second intermediate signal. The first intermediate signal and the second intermediate signal are applied to a first logical OR gate 94, which produces a second mode output signal (mode 2 signal).

Figure 8:
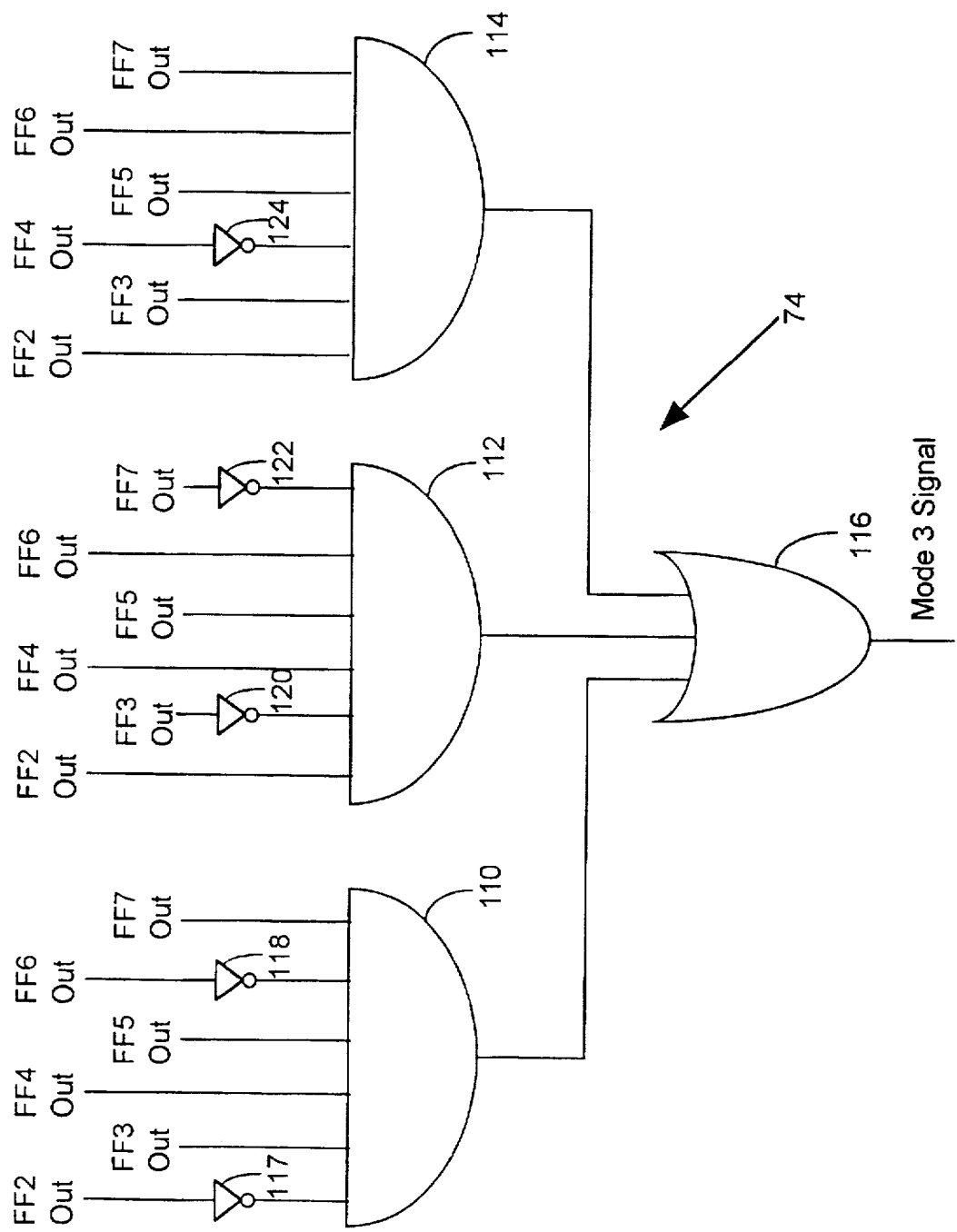
FIG. 8 illustrates a portion of the tapped pipeline signal combinational logic circuit in accordance with an embodiment of the invention.

FIG. 8 illustrates a third mode circuit 74 that may be used in accordance with the invention. The third mode circuit 74 includes a fourth logical AND gate 110, which receives phase detection logic pipeline output signals from output nodes FF2 out through FF7 out. The signal from the output node FF2 out is inverted by inverter 117, while the signal from the output node FF6 is inverted by inverter 118. The third mode circuit 74 also includes a fifth logical AND gate 112, which receives phase detection logic pipeline output signals from output nodes FF2 out through FF7 out. The signal from the output node FF3 out is inverted by inverter 120 and the signal from the output node FF5 is inverted by the inverter 122. The third mode circuit 74 also includes a sixth logical AND gate 114. The signal from the output node FF4 is inverted by inverter 124.

The fourth logical AND gate 110 generates a third intermediate signal, the fifth logical AND gate 112 generates a fourth intermediate signal, while the sixth logical AND gate 92 generates a fifth intermediate signal. The third, fourth, and fifth intermediate signals are applied to a second logical OR gate 116, which produces a third mode output signal (mode 3 signal).

Figure 1:
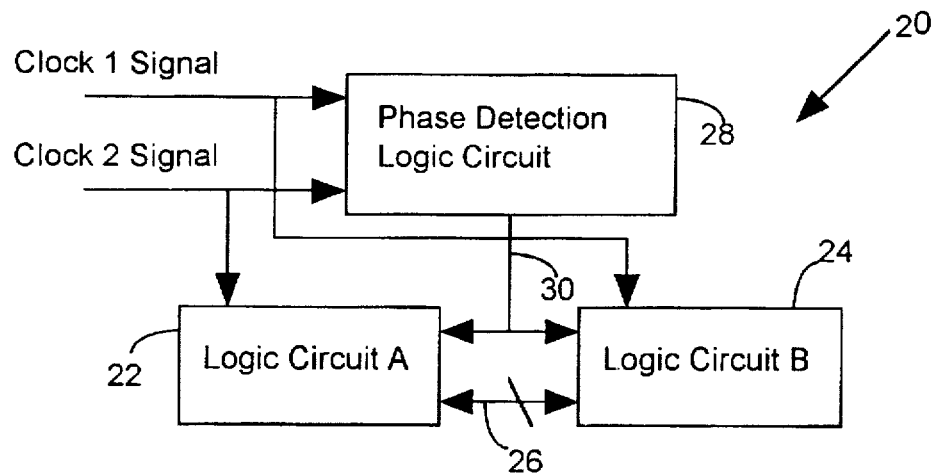
FIG. 1 illustrates a complex integrated circuit with phase detection logic that allows different logic regions operating at different clock frequencies to exchange data.
Figure 2:
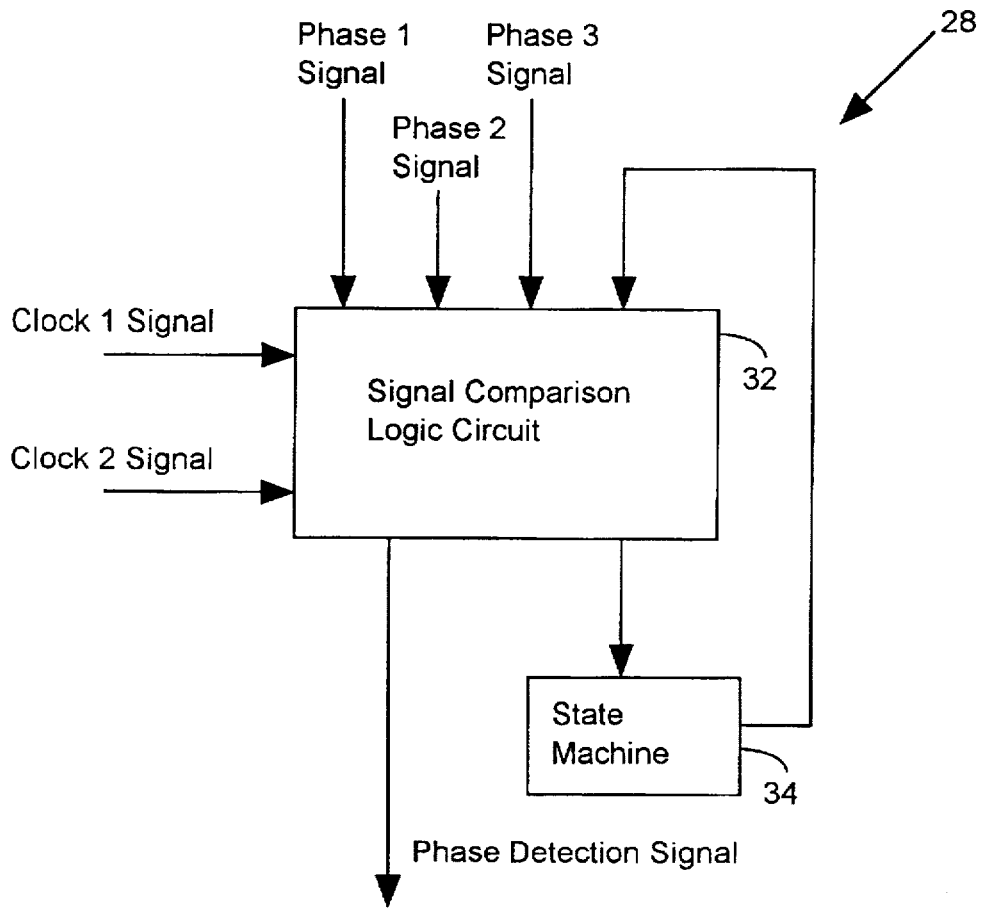
FIG. 2 illustrates a prior art phase detection logic circuit utilizing signal comparison logic and a state machine.

FIGS. 4 and 6–8 demonstrate that a relatively small amount of silicon is used to implement a phase detection circuit. Unlike the prior art phase detection circuit of FIG. 2, the phase detection circuit of the invention can dynamically adjust to changing input clock frequencies.

Those skilled in the art will recognize that the phase detection circuit of the invention is easily scaled for a large number of input clock signals. As demonstrated in the figures, the invention can be implemented with widely used logical elements, such as flip-flops, logical AND gates, and logical OR gates.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A circuit for generating a phase detection signal, comprising:

a phase detection logic pipeline to generate phase detection logic pipeline output signals from a first input clock signal and a second input clock signal; and a tapped pipeline signal combinational logic circuit connected to said phase detection logic pipeline, said tapped pipeline signal combinational logic circuit logically combining said phase detection logic pipeline output signals to generate a phase detection signal that indicates the phase relationship between said first input clock signal and said second input clock signal, such that said phase detection signal allows the exchange of data between a first logic circuit operating in response to said first input clock signal and a second logic circuit operating in response to said second input clock signal.

2. The circuit of claim 1 wherein said phase detection logic pipeline includes a plurality of serially connected flip-flops.

3. The circuit of claim 2 wherein said phase detection logic pipeline includes a plurality of logic pipeline output nodes connected between said serially connected flip-flops to carry said phase detection logic pipeline output signals.

4. The circuit of claim 3 wherein said first input clock signal is applied to a first flip-flop of said serially connected flip-flops and thereby generates a pipeline signal that is driven through said serially connected flip-flops.

5. The circuit of claim 4 wherein a plurality of said serially connected flip-flops are clocked by said second input clock signal.

6. The circuit of claim 1 wherein said tapped pipeline signal combinational logic circuit includes a first mode circuit, a second mode circuit, and a third mode circuit to process said phase detection logic pipeline output signals.

7. The circuit of claim 6 wherein said first mode circuit includes a first logical AND gate to generate a first mode output signal from said phase detection logic pipeline output signals.

8. The circuit of claim 7 wherein said second mode circuit includes a second logical AND gate and a third logical AND gate to generate a first intermediate signal and a second intermediate signal from said phase detection logic pipeline output signals; and a first logical OR gate to generate a second mode output signal from said first intermediate signal and said second intermediate signal.

9. The circuit of claim 8 wherein said third mode circuit includes a fourth logical AND gate, a fifth logical AND gate, and a sixth logical AND gate to generate a third intermediate signal, a fourth intermediate signal, and a fifth intermediate signal from said phase detection logic pipeline output signals; and a second logical OR gate to generate a third mode output signal from said third intermediate signal, said fourth intermediate signal, and said fifth intermediate signal.

10. The circuit of claim 9 further comprising a mode signal logical OR gate or generate said phase detection signal from said first mode output signal, said second mode output signal, and said third mode output signal.

11. The circuit of claim 1 further comprising:

an output node to carry said phase detection signal;

a first logical circuit connected to said output node, said first logical circuit operating in response to a first clock signal; and a second logical circuit connected to said output node, said second logical circuit operating in response to a second clock signal, said phase detection signal being processed by said first logical circuit and said second logical circuit.

12. The circuit of claim 11 wherein said first logical circuit and said second logical circuit form a portion of a microprocessor for use in a general purpose computer.

13. A method of constructing a circuit that generates a phase detection signal, said method comprising the steps of:

providing a phase detection logic pipeline to generate phase detection logic pipeline output signals from a first input clock signal and a second input clock signal; and providing a tapped pipeline signal combinational logic circuit connected to said phase detection logic pipeline, said tapped pipeline signal combinational logic circuit logically combining said phase detection logic pipeline output signals to generate a phase detection signal that indicates the phase relationship between said first input clock signal and said second input clock signal, such that said phase detection signal allows the exchange of data between a first logic circuit operating in response to said first input clock signal and a second logic circuit operating in response to said second input clock signal.

14. The method of claim 13 further comprising the step of providing a phase detection logic pipeline with a plurality of serially connected flip-flops.

15. The method of claim 14 further comprising the step of providing a phase detection logic pipeline with a plurality of logic pipeline output nodes connected between said serially connected flip-flops to carry said phase detection logic pipeline output signals.

16. The method of claim 15 further comprising the step of applying said first input clock signal to a first flip-flop of said serially connected flip-flops and thereby generating a pipeline signal that is applied to each of said serially connected flip-flops.

17. The method of claim 16 further comprising the step of clocking said serially connected flip-flops with said second input clock signal.

18. The method of claim 13 further comprising the step of providing said tapped pipeline signal combinational logic circuit with a first mode circuit, a second mode circuit, and a third mode circuit to process said phase detection logic pipeline output signals.

19. A method of generating a phase detection signal, said method comprising the steps of:

generating phase detection logic pipeline output signals from a first input clock signal and a second input clock signal; and producing from said phase detection logic pipeline output signals a phase detection signal that indicates the phase relationship between said first input clock signal and said second input clock signal, such that said phase detection signal allows the exchange of data between a first logic circuit operating in response to said first input clock signal and a second logic circuit operating response to said second input lock signal.

20. The method of claim 19 wherein said generating step includes the step of applying said first input clock to a first logic pipeline flip-flop to generate a pipeline signal.

21. The method of claim 20 wherein said generating step includes the step of applying said second input clock to a plurality of serially connected flip-flops to drive said pipeline signal through a plurality of said serially connected flip-flops.

22. The method of claim 19 wherein said producing step includes the step of combining said phase detection logic pipeline output signals with logical gates.

* * * * *